United States Patent
Tokunaga

(10) Patent No.: US 7,344,420 B2
(45) Date of Patent: Mar. 18, 2008

(54) CURRENT SENSOR AND MOUNTING STRUCTURE THEREOF

(75) Inventor: Masatoshi Tokunaga, Chiryu (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 11/208,535

(22) Filed: Aug. 23, 2005

(65) Prior Publication Data

US 2006/0057899 A1    Mar. 16, 2006

(30) Foreign Application Priority Data

Sep. 14, 2004   (JP) ............................. 2004-267202

(51) Int. Cl.
*H01R 4/28* (2006.01)

(52) U.S. Cl. ...................... 439/754; 435/135
(58) Field of Classification Search ............... 439/754, 439/756, 763, 522; 429/91, 90, 61; 435/135
See application file for complete search history.

(56) References Cited

U.S. PATENT DOCUMENTS

| | | | | |
|---|---|---|---|---|
| 4,675,255 A | * | 6/1987 | Pfeifer et al. | ............... 429/92 |
| 6,428,363 B2 | * | 8/2002 | Tamai et al. | ............... 439/756 |
| 6,551,147 B2 | | 4/2003 | Wakata et al. | |
| 6,808,841 B2 | * | 10/2004 | Wakata et al. | ............... 429/91 |

FOREIGN PATENT DOCUMENTS

JP    A-2002-280083    9/2002

* cited by examiner

*Primary Examiner*—Briggitte R. Hammond
(74) *Attorney, Agent, or Firm*—Posz Law Group, PLC

(57) ABSTRACT

A linking member formed of a conductive material is integrated with a current sensor. An end of the linking member is linked and fixed to a battery terminal connected with a battery post of a battery and the other end is linked and fixed to a connecting terminal of a harness. At least a part of the current sensor having the linking member, the harness having the connecting terminal, and a fixing member that links and fixes the linking member and the connecting terminal is fixed to the battery to contact the battery in a state in which the linking member is linked and fixed to the battery terminal and the connecting terminal. Thus, vibration resistance and connection reliability of the current sensor can be improved.

12 Claims, 3 Drawing Sheets

CURRENT SENSOR AND MOUNTING STRUCTURE THEREOF

CROSS REFERENCE TO RELATED APPLICATION

This application is based on and incorporates herein by reference Japanese Patent Application No. 2004-267202, filed on Sep. 14, 2004.

BACKGROUND OF THE INVENTION

1. Field of the Invention

The present invention relates to a current sensor and a mounting structure thereof that enables the current sensor to be stably mounted between and interconnected with a vehicle battery and a load harness.

2. Description of Related Art

JP-A-2002-141054 describes a mounting structure for interposing a current sensor between a vehicle battery and a load harness. In this mounting structure, a relay member linked by a fastening member is interposed between a battery-side terminal connected to a battery post of the battery and a harness-side terminal connected to a tip end of the harness. The current sensor is attached to the relay member. A conventional battery-side terminal and harness-side terminal are used in this mounting structure.

The harness including the current sensor having the relay member and the harness-side terminal is fixed to the battery through the battery-side terminal, which is connected to the battery post. Such a cantilever structure, a supporting point of which is the battery-side terminal, vibrates when an external force is applied thereto. In such a case, there is a possibility that the linked portions may be loosened or that the terminals or the relay member may be damaged, thereby reducing connection reliability of the current sensor.

SUMMARY OF THE INVENTION

It is therefore an object of the present invention to provide a current sensor mounting structure that is capable of improving the connection reliability of the current sensor.

According to an aspect of the present invention, a linking member formed of a conductive material is integrated with a current sensor. An end of the linking member is linked and fixed to a battery terminal connected with a battery post of a battery and the other end is linked and fixed to a connecting terminal of a harness. At least a part of the current sensor having the linking member, the harness having the connecting terminal, and a fixing member that links and fixes the linking member and the connecting terminal is fixed to the battery to contact the battery in a state in which the linking member is linked and fixed to the battery terminal and the connecting terminal.

Thus, the current sensor and the harness are fixed to the battery not only at the battery terminal but also at an additional location or locations. Accordingly, vibration resistance and connection reliability of the current sensor can be improved.

BRIEF DESCRIPTION OF THE DRAWINGS

Features and advantages of embodiments will be appreciated, as well as methods of operation and the function of the related parts, from a study of the following detailed description, the appended claims, and the drawings, all of which form a part of this application. In the drawings:

DETAILED DESCRIPTION OF THE PREFERRED EMBODIMENT

Figure 1A:
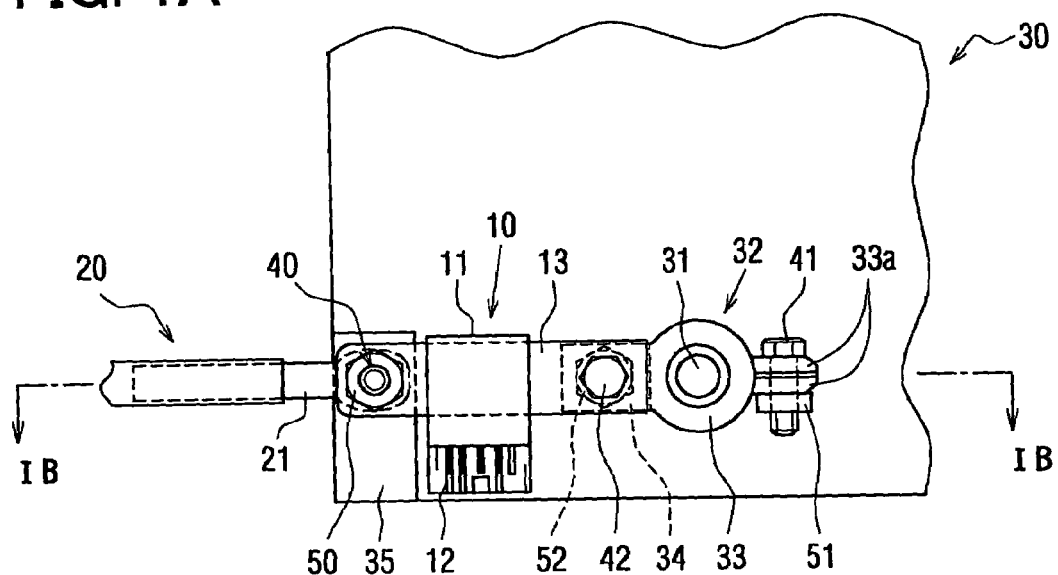
FIG. 1A is a plan view showing a mounting structure of a current sensor according to a first embodiment of the present invention.
Figure 1B:
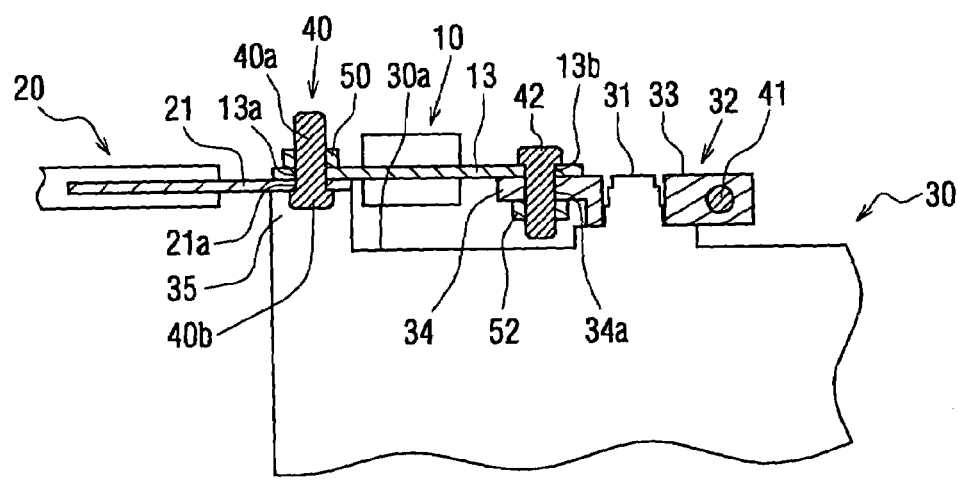
FIG. 1B is a sectional view of the mounting structure of the current sensor of FIG. 1A taken along the line IB-IB.

Referring to FIGS. 1A and 1B, a current sensor 10 and its associated mounting structure according to a first embodiment of the present invention is illustrated. In the mounting structure of the current sensor 10 shown in FIGS. 1A and 1B, the current sensor 10 is interposed between a harness 20, which is connected to a load, and a battery 30, which is mounted on a vehicle.

The current sensor 10 has a sensor portion 11, a connector portion 12, and a linking member 13 made of a conductive material for electrically connecting the harness 20 with the battery 30.

The sensor portion 11 is a magnetic proportional sensor having a Hall element (not shown), for example. If a discharging current flows through the linking member 13 from the battery 30 or a charging current flows through the linking member 13 to the battery 30, a magnetic flux is generated between both ends of a substantially C-shaped sensor core (not shown) in accordance with intensity of the current. The sensor portion 11 detects the discharging current or the charging current by detecting the magnetic flux with the Hall element.

The linking member 13 is formed of a copper plate, for example. Through holes 13a, 13b for linking the current sensor 10 to other components as will be described below and for fixing the sensor 10 to the battery 30 are formed at both ends of the linking member 13. The linking member 13 is embedded in a resin, which protects the Hall element and the sensor core, through an insert molding process so that a predetermined area of the linking member 13 between both through holes 13a, 13b penetrates the core. Thus, by integrating the linking member 13 with the current sensor 10 through the insert molding process, body size of the current sensor 10 including the linking member 13 can be reduced. Alternatively, a through hole may be formed in the current sensor 10 having the C-shaped sensor core, and the linking member 13 may penetrate the through hole of the current sensor 10 so that the current sensor 10 and the linking member 13 are integrated.

The harness 20 has a connecting terminal 21 at an end thereof closest to the battery 30. A through hole 21a is formed near a tip end of the connecting terminal 21 for linking and fixing the linking member 13 thereto. The connecting terminal 21 is overlapped with the linking member 13 to align the through hole 21a with the through hole 13a. A bolt 40 extends through the through holes 13a, 21a, and a nut 50 is threadably engaged with a threaded portion 40a of the bolt to fasten and fix the connecting terminal 21 to the linking member 13.

The battery 30 has a pair of battery posts 31 (only one is shown for ease of illustration) that function as electrodes on an upper face thereof. The battery terminal 32 is connected to the battery post 31 in a conventional manner.

The battery terminal 32 is formed from a shaped metal plate and has a fastening portion 33 and a mounting portion 34. An end of the fastening portion 33 includes a clamp section 33a through which a bolt 41 is inserted. The bolt 41 is then screwed into the nut 51 to cause the clamp section 33a to clamp the fastening portion 33 to the battery post 31. The mounting portion 34 and the fastening portion 33 are formed as a single piece so that the mounting portion 34 extends from the fastening portion 33. A through hole 34a is formed near a tip end of the mounting portion 34 for linking and fixing the mounting portion 34 to the linking member 13. The mounting portion 34 is overlapped with the linking member 13 to align the through hole 34a with the through hole 13a. A bolt 42 is screwed into a nut 52 to fasten and fix the mounting portion 34 to the linking member 13.

The battery 30 has a holding portion 35 that is formed as a part of a case of the battery 30 and that protrudes upwardly from a top surface 30a of the battery 30 on which the battery post 31 is formed. The bolt 40 for linking and fixing the connecting terminal 21 and the linking member 13 is fixed to the holding portion 35. A head portion 40b of the bolt 40 is embedded in the holding portion 35 through an insert molding process so that a threaded portion 40a of the bolt 40 protrudes from the top surface 30a of the battery 30 in a substantially orthogonal direction.

The holding portion 35 is set so that the height of the holding portion 35 relative to the top surface 30a of the battery 30 substantially coincides with a distance between a lower connection surface of the linking member 13 and the connecting terminal 21 (a lower surface of the connecting terminal 21 in the present embodiment) and the top surface 30a of the battery 30 when the connecting terminal 21 is connected with the battery terminal 34 through the linking member 13.

Next, a method of mounting the current sensor 10 will be explained.

First, an end of the linking member 13 is overlapped with the mounting portion 34 of the battery terminal 32 so that the through holes 13b, 34a are aligned. Then, the bolt 42 is inserted through the aligned through holes 13b, 34a and screwed into nut 52 to fasten and fix the end of the linking member 13 to the mounting portion 34 at a first sensor mounting location. Thus, the battery terminal 32 and the current sensor 10 are integrated.

The through hole 21a of the connecting terminal 21 and the through hole 13a of the linking member 13 are aligned and then respectively inserted over the threaded portion 40a of the bolt 40 protruding from the holding portion 35. The fastening portion 33 of the battery terminal 32 is disposed to clamp onto the battery post 31 while the screw portion 40a is inserted to the through hole 13a of the linking member 13, and the fastening portion 33 is fastened and fixed by screwing the bolt 41 to the nut 51. The nut 50 is screwed onto the threaded portion 40a of the bolt 40 to fasten and fix the terminal 21 and the linking member 13 and to thereby integrate the harness 20 and the current sensor 10 at a second sensor mounting location.

Thus, the battery terminal 32 is connected to the battery post 31, and the current sensor 10 is attached between the harness 20 and the battery 30. The order of mounting the current sensor 10 is not limited to the above example.

Thus, in the mounting structure of the current sensor 10 of the present exemplary embodiment, both the fastening portion 33 and the bolt 40, the head portion 40b of which is embedded in the holding portion 35 of the battery 30, are fixed to the battery 30. Therefore, the current sensor 10, the harness 20 and the battery terminal 32, which are integrated as described above, are fixed to the battery 30 at multiple battery locations. As a result, vibration resistance and connection reliability of the current sensor 10 can be improved.

The head portion 40b of the bolt 40 is fixed to the battery 30, i.e., the head portion 40b is embedded in the holding portion 35. Therefore, there is no need to link and fix the linking member 13 of the current sensor 10 and the connecting terminal 21 of the harness 20 in a conventional unsupported manner. Accordingly, ease of assembly can be improved. In addition, because the bolt 40 is fixed to the battery 30 through an insert molding process, the number of parts required for the mounting structure can be reduced.

The head portion 40b of the bolt 40 is embedded in the holding portion 35 of the battery 30, and the linking member 13 and the connecting terminal 21 are secured between the holding portion 35 and the nut 50. Thus, because the linking member 13 and the connecting terminal 21 are fixed over a wide area, the connection reliability of the current sensor 10 can be further improved.

Figure 2:
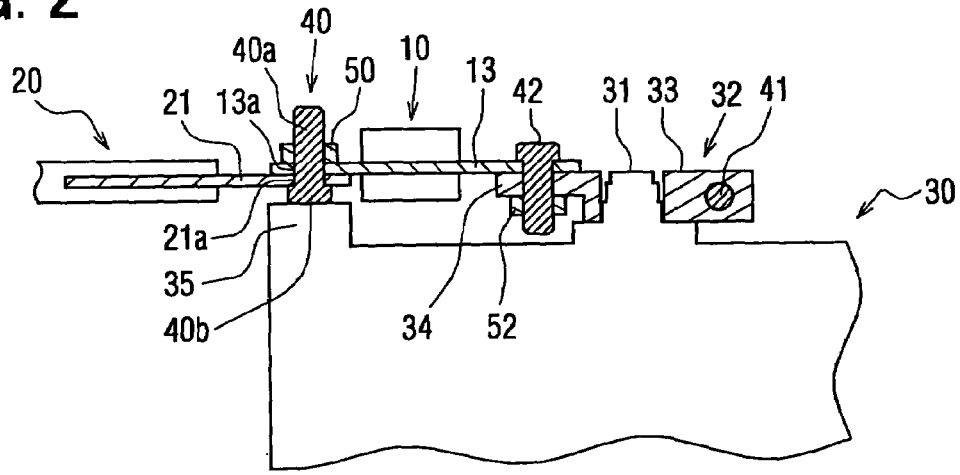
FIG. 2 is a sectional view of a mounting structure of a current sensor of a modified example of the first embodiment.

In the present exemplary embodiment, the bolt 40 is fixed to the battery 30 by embedding the head portion 40b in the holding portion 35 through an insert molding process. However, the method of fixing the bolt 40 to the battery 30 is not limited to this method. For example, as shown in FIG. 2, the head portion 40b of the bolt 40 may be bonded and fixed to the holding portion 35, the screw portion 40a may be inserted into the connecting terminal 21 and the linking member 13, and the connecting terminal 21 and the linking member 13 may be fastened and fixed by screwing the nut 50 onto the threaded portion 40a of the bolt 40. In this case, if a groove is formed on the holding portion 35 and the head portion 40b is bonded into the groove, the linking member 13 and the connecting terminal 21 can be held between the holding portion 35 and the nut 50.

Alternatively, the holding portion 35 may be prepared as a separate part and may be fixed to the top surface 30a of the battery 30.

Next, a mounting structure of the current sensor 10 according to a second embodiment of the present invention will be explained based on FIG. 3.

Figure 3:
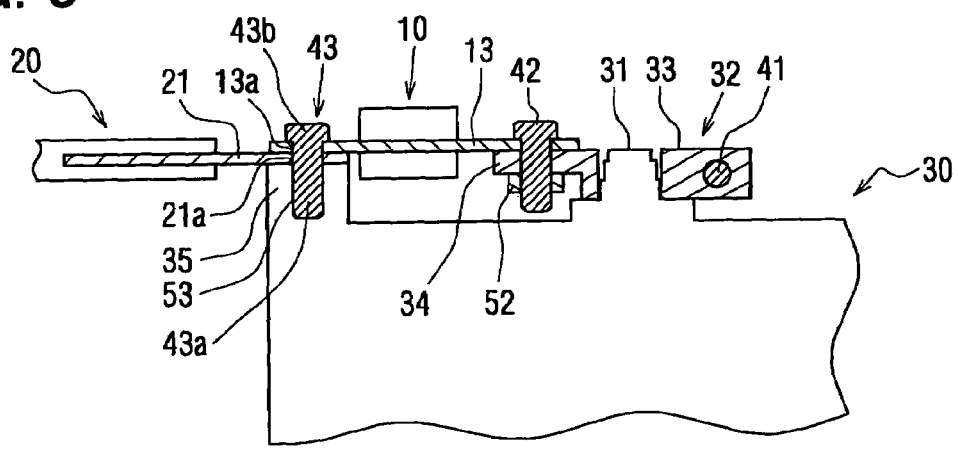
FIG. 3 is a sectional view showing a mounting structure of a current sensor according to a second embodiment of the present invention.

In the second embodiment, a threaded bore 53 is formed in the holding portion 35 as shown in FIG. 3. The connecting terminal 21 and the linking member 13 are positioned on the holding portion 35 so that the through holes 13a, 21a are aligned with the threaded bore 53. A threaded portion 43a of a bolt 43 is inserted through the through holes 13a, 21a and screwed into the threaded bore 53 to hold the linking member 13 and the connecting terminal 21 between a head portion 43b of the bolt 43 and the holding portion 35 to integrate the current sensor 10 and the harness 20.

Thus, in the mounting structure of the current sensor 10 according to the second embodiment, the bolt 43 as a fixing member is fixed to the holding portion 35 of the battery 30. Therefore, the integrated current sensor 10, the harness 20 and the battery terminal 32 are fixed to the battery 30 at multiple mounting locations. Accordingly, the vibration resistance and the connection reliability of the current sensor 10 can be improved.

In the second exemplary embodiment, because the threaded bore 53 as a fixing member is formed in the holding portion 35, there is no need to link and fix the linking member 13 of the current sensor 10 and the connecting terminal 21 of the harness 20 in a conventional unsupported manner. Accordingly, the ease of assembly can be improved. Moreover, as the nut 50 of the first embodiment is not used, the number of the parts can be further reduced.

In addition, because the linking member 13 and the connecting terminal 21 are held between the holding portion 35 and the head portion 43*b* of the bolt 43, the linking member 13 and the connecting terminal 21 are fixed over a wide area. As a result, the connection reliability of the current sensor 10 can be further improved.

Next, a mounting structure of the current sensor 10 according to a third embodiment of the present invention will be explained based on FIG. 4.

Figure 4:
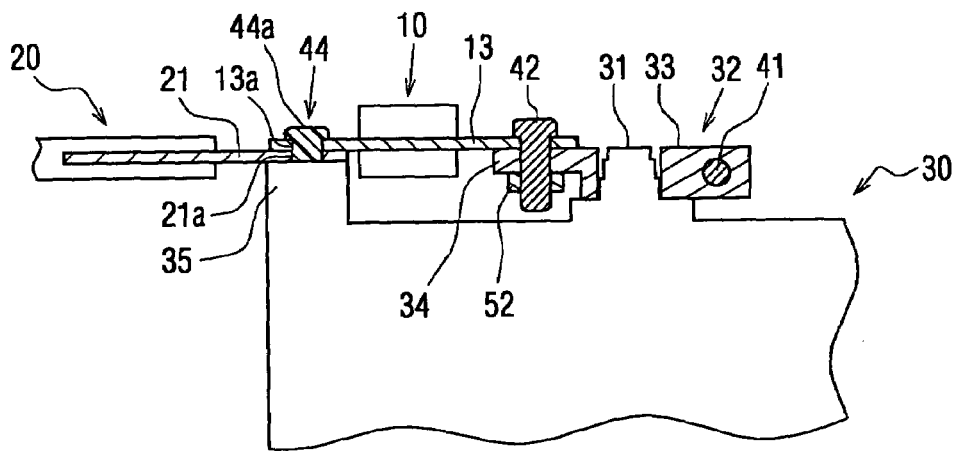
FIG. 4 is a sectional view showing a mounting structure of a current sensor according to a third embodiment of the present invention.

As shown in FIG. 4, an extending portion 44 extending upwardly from the holding portion 35 of the battery 30 is formed. The extending portion 44 is formed of a resin and is integrated with the holding portion 35. The through holes 13*a*, 21*a* are inserted over the extending portion 44 to position the connecting terminal 21 and the linking member 13 on the holding portion 35. In this state, an end portion 44*a* of the extending portion 44 protruding from the linking member 13 is heated and crimped to hold the linking member 13 and the connecting terminal 21 between the end portion 44*a* and the holding portion 35 and thereby to integrate the current sensor 10 and the harness 20.

Thus, in the mounting structure of the current sensor 10 according to the third embodiment, the extending portion 44 as a fixing member is fixed to the holding portion 35 of the battery 30. The integrated current sensor 10, the harness 20 and the battery terminal 32 are fixed to the battery 30 at multiple locations. Accordingly, the vibration resistance and the connection reliability of the current sensor 10 can be improved.

In the above described third embodiment, the extending portion 44 as a fixing member is formed on the holding portion 35. Therefore, there is no need to link and fix the linking member 13 of the current sensor 10 and the connecting terminal 21 of the harness 20 in a conventional unsupported manner. As a result, ease of assembly can be improved. Moreover, as the nut 50 of the first embodiment is not used, the number of the parts can be reduced.

Also, because the linking member 13 and the connecting terminal 21 are held between the holding portion 35 and the end portion 44*a* of the extending portion 44, the linking member 13 and the connecting terminal 21 are fixed over a wide area. As a result, the connection reliability of the current sensor 10 can be improved.

Next, a mounting structure of the current sensor 10 according to a fourth embodiment will be explained based on FIG. 5.

Figure 5:
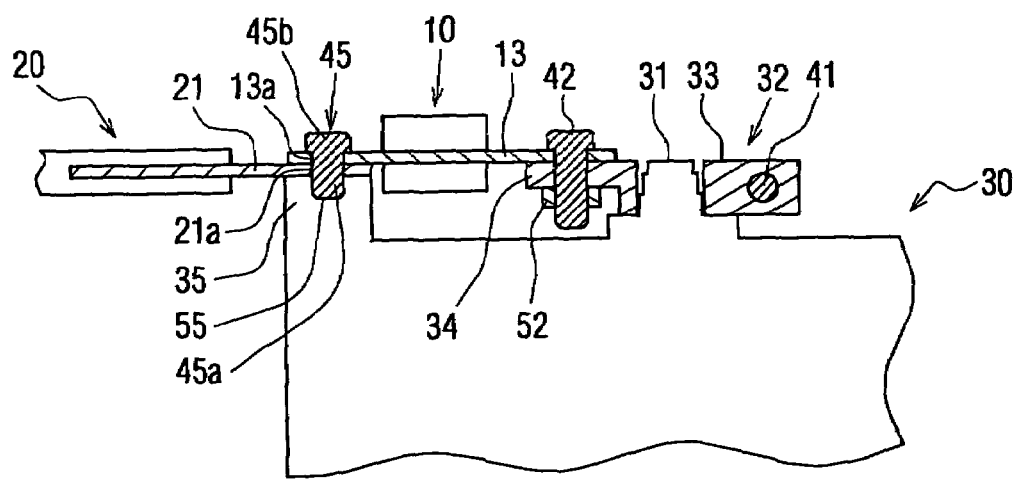
FIG. 5 is a sectional view showing a mounting structure of a current sensor according to a fourth embodiment of the present invention.

As shown in FIG. 5, a groove 55 is formed in the holding portion 35. The connecting terminal 21 and the linking member 13 are positioned on the holding portion 35 so that the through holes 13*a*, 21*a* align with the groove 55. A press-fit fixing portion 45*a* of a fixing screw 45 is inserted through the through holes 13*a*, 21*a* and press-fit and fixed within the groove 55. The linking member 13 and the connecting terminal 21 are held between a head portion 45*b* of the press-fit fixing screw 45 and the holding portion 35. Thus, the current sensor 10 and the harness 20 are integrated.

In the mounting structure of the current sensor 10 according to the fourth embodiment, the fixing screw 45 as a fixing member is fixed to the holding portion 35 of the battery 30. Thus, the integrated current sensor 10, the harness 20 and the battery terminal 32 are fixed to the battery 30 at multiple locations. Accordingly, the vibration resistance and the connection reliability of the current sensor 10 can be improved.

The groove 55 as a fixing member is formed in the holding portion 35. Therefore, there is no need to link and fix the linking member 13 of the current sensor 10 and the connecting terminal 21 of the harness 20 in a conventional unsupported manner. Accordingly, ease of assembly can be improved. Moreover, as the nut 50 of the first embodiment is not used, the number of parts required to mount the current sensor can be reduced.

Further regarding the above described fourth embodiment, the linking member 13 and the connecting terminal 21 are held between the holding portion 35 and the head portion 45*b* of the fixing screw 45. Thus, as the linking member 13 and the connecting terminal 21 are fixed over a wide area, the connection reliability of the current sensor 10 can be improved.

Finally, although the fixing screw 45 is described above as being press-fit into the groove 55, the fixing screw 45 may be fit into the groove 55 in an alternate manner such as, for example, via a friction fit.

Figure 6:
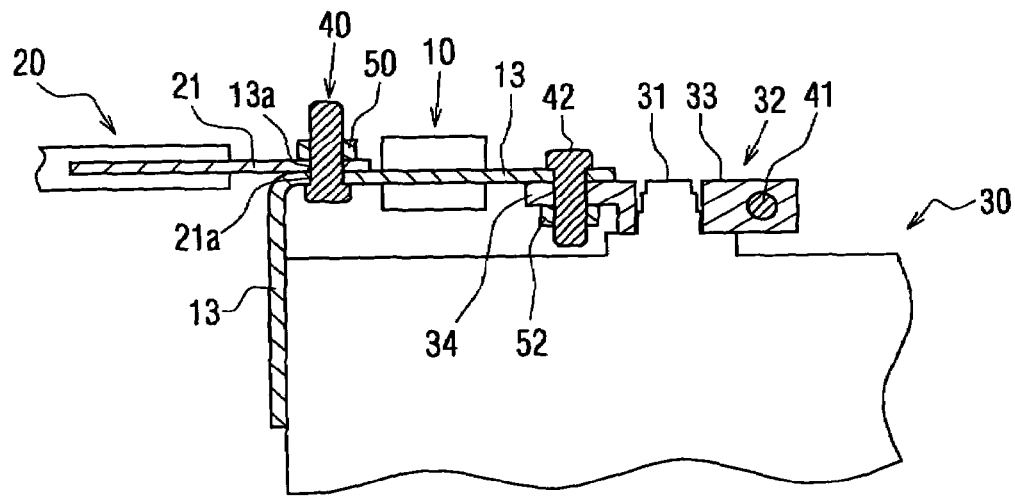
FIG. 6 is a sectional view showing a mounting structure of a current sensor of a modified example of the first to fourth embodiments.

In the above described embodiments, the fastening portion 33 of the battery terminal 32 and a part of the fixing member, which links and fixes the linking member 13 and the connecting terminal 21, are fixed to the battery 30. Alternatively, any other member than the above fixing member (such as bolt 40, bolt 43 and threaded bore 53, extending portion 44 or fixing screw 45 and groove 55) and the fastening portion 33 of the battery terminal 32 may be fixed to the battery 30. Any structure can be employed if at least a part of the current sensor 10 having the linking member 13, the harness 20 having the connecting terminal 21 and the fixing member that links and fixes the linking member 13 and the connecting terminal 21 is fixed to the battery 30 in the structure, e.g. as shown in FIG. 6. In FIG. 6, the linking member 13 is extended along the harness 20 and bent. An end of the linking member 13 is fixed to a side surface of the battery 30. Alternatively, a bottom surface of the current sensor 10 may be bonded and fixed to the top surface 30*a* of the battery 30, for example. If a point at which the current sensor 10 is fixed to the battery 30 is made to be detachable, the current sensor 10 can be reused when the battery 30 is replaced.

In the above embodiments, the current sensor 10 is fixed to the battery 30 at two locations—at the fastening portion 33 of the battery terminal 32 and at the fixing member that links and fixes the linking member 13 and the connecting terminal 21. Alternatively, the current sensor 10 may be fixed to the battery 30 at three or more points.

In the above embodiments, the holding portion 35 is formed on the battery 30, and a part of the fixing member is fixed to the holding portion 35 in order to hold and fix the integrated current sensor 10, harness 20 and battery terminal 32 without creating a load on the current sensor 10. Alternatively, the holding portion 35 may be omitted. For example, the linking member 13 may be bent so that the lower surface of the current sensor 10 contacts the top surface 30*a* of the battery 30. The linking member 13 can be integrated with the current sensor 10 through an insert molding process. For example, the current sensor 10 can be bonded and fixed to the battery 30.

A part of the fixing member (bolt 40, threaded bore 53, extended portion 44, or groove 55) that fixes the linking member 13 and the connecting terminal 21 is disposed in the battery 30 in order to reduce the increase of the number of the parts. Alternatively, another fixing portion may be formed on the battery 30 in order to fix at least a part of the current sensor 10 having the linking member 13, the harness 20 having the connecting terminal 21 and the fixing member that links and fixes the linking member 13 and the connecting terminal 21.

In the above embodiments, the current sensor 10 is a magnetic proportional sensor having a Hall element. However, other sensors, such as, for example, a magnetic balance sensor, can be used as the current sensor 10.

The present invention should not be limited to the disclosed embodiments, but may be implemented in many other ways without departing from the spirit of the invention.

What is claimed is:

1. A mounting structure comprising:
   a current sensor located between a harness having a connecting terminal and a battery having a battery post;
   a linking member that is formed of a conductive material and is integrated with the current sensor;
   a battery terminal connected with the battery post of the battery; and
   a fixing member that links and fixes the linking member and the connecting terminal, wherein
   an end of the linking member is linked and fixed to the battery terminal and the other end is linked and fixed to the connecting terminal, and
   at least a part of the current sensor having the linking member, the harness having the connecting terminal, and the fixing member is fixed to the battery to be in contact with the battery in an area other than the battery post in a state in which the linking member is linked and fixed to the battery terminal and the connecting terminal.

2. The mounting structure of claim 1, wherein the linking member is bent and fixed to the battery.

3. The mounting structure of claim 1, wherein: the battery is formed with a groove on a housing thereof; and at least a part of the current sensor, the harness, and the fixing member is fit or press-fit into the groove.

4. The mounting structure of claim 1, wherein the linking member is integrated with the current sensor through an insert molding process.

5. The mounting structure of claim 1, wherein the battery has a holding portion protruding from a top surface thereof, on which the battery post is formed, the holding portion contacting at least a part of the current sensor, the harness, and the fixing member.

6. The mounting structure of claim 5, wherein the holding portion is formed so that a height thereof from the top surface substantially coincides with a distance between the top surface and a point, at which the holding portion contacts at least the part of the current sensor, the harness, and the fixing member.

7. The mounting structure of claim 1, wherein: the linking member and the connecting terminal are formed with through holes respectively, the through holes being aligned in a state in which the linking member and the connecting terminal are overlapped; and the fixing member is inserted into the through holes to link and fix the linking member and the connecting terminal and is fixed to the battery.

8. The mounting structure of claim 7, wherein: the battery is formed with a threaded bore in a housing thereof; the fixing member is a male screw screwed into the threaded bore in a state in which to male screw extends through the through holes of the linking member and the connecting terminal; and the linking member and the connecting terminal are held between a head portion of the male screw and the battery.

9. The mounting structure of claim 7, wherein: the fixing member is an extending portion that is made of a resin and that extends upwardly from the top surface; the extending portion is heat-crimped in a state in which the extending portion penetrates the through holes of the linking member and the connecting terminal; and the linking member and the connecting terminal are held between the battery and an end of the extending portion that is heat-crimped.

10. The mounting structure of claim 7, wherein: the fixing member is a bolt, a head portion of which is fixed to the battery; and the bolt is threadably engaged with a nut in a state in which a screw portion of the bolt extends through the linking member and the connecting terminal.

11. The mounting structure of claim 10, wherein: the bolt is inserted into a housing of the battery so that the screw portion is exposed; and the linking member and the connecting terminal are held between the battery and the nut.

12. The mounting structure of claim 10, wherein: the battery is formed with a groove on a housing thereof; the bolt is bonded and fixed to the housing in a state in which the head portion of the bolt is disposed in the groove; and the linking member and the connecting terminal are held between the battery and the nut.

* * * * *